United States Patent
Hsu et al.

(10) Patent No.: US 7,253,458 B2
(45) Date of Patent: Aug. 7, 2007

(54) CMOS IMAGE SENSOR

(75) Inventors: Tzu-Hsuan Hsu, Kaohsiung (TW); Dun-Nian Yaung, Taipei (TW); Wen-De Wang, Minsyong Township, Chiayi County (TW); Ho-Ching Chien, Hsinchu (TW); Shou-Gwo Wuu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 134 days.

(21) Appl. No.: 10/980,959

(22) Filed: Nov. 4, 2004

(65) Prior Publication Data

US 2006/0054939 A1    Mar. 16, 2006

(51) Int. Cl.
    *H01L 27/148*     (2006.01)

(52) U.S. Cl. .................. 257/229; 257/225; 257/231; 257/234; 257/E27.132; 257/E27.134

(58) Field of Classification Search .................. 257/59, 257/258, 290–293, 225–234
See application file for complete search history.

(56) References Cited

U.S. PATENT DOCUMENTS

2006/0001059 A1 *    1/2006    Mouli et al. ................. 257/292

\* cited by examiner

*Primary Examiner*—Anh Duy Mai
(74) *Attorney, Agent, or Firm*—Thomas, Kayden, Horstemeyer & Risley

(57) ABSTRACT

A complementary metal oxide semiconductor field effect transistor (CMOS-FET) image sensor. An active photosensing pixel is formed on a substrate. At least one side of the pixel has a width equal to or less than approximately 3 µm. At least one dielectric layer is disposed on the substrate covering the pixel. A color filter is disposed on the least one dielectric layer. A microlens array is disposed on the color filter of the pixel, and the sum of the thickness of all dielectric layers and the color filter divided by the pixel width is equal to or less than approximately 1.87.

24 Claims, 8 Drawing Sheets ered the active photosensing pixel. A color filter 260 is

CMOS IMAGE SENSOR

BACKGROUND

The present invention relates to an electronic device, and more particularly, to an image sensor device.

CMOS image sensor devices are used in a wide variety of applications, such as digital still camera (DSC) applications. These devices utilize an array of active pixels or image sensor cells, comprising photodiode elements, to collect photo energy to convert images to streams of digital data.

For DSC applications, high-performance imaging with low crosstalk and noise, providing superior low-light performance is required.

Image sensor devices typically suffer from crosstalk, occurring when radiation over one photodetector device is reflected or refracted within the image sensing pixel. The reflected or refracted radiation is detected by the photodetector device of other pixels, thus causing picture distortion. Crosstalk is measured by providing an opaque mask over a photodetector device array that allows radiation (e.g., light) to enter the IC over only one underlying device. Adjacent device response is then measured and the undesired signal divided by desired signal is calculated and defined as crosstalk. Informal industry requirements for high density image sensor provide crosstalk of less than 50% at an oblique incident angle of 15°.

In FIG. 1, a typical structure 100 for measuring crosstalks of an image sensor device is illustrated in cross section, comprising a semiconductor substrate 101 having an array of photodiodes 120 therein. Each photodiode 120 comprises, for example, an n-type region 124 in a p-type region 122. Each photodiode 120 is separated from other photodiodes by an array of isolation structures 110, such as shallow trench isolation (STI). Thus, an array of pixels is obtained. A layer of metal 140 comprising an opening is formed on dielectric layers 130. The opening defined a pixel region for measuring crosstalks of the image sensor. The pixels convert incoming light 160 and 160' from a light/image source to electrical signals via the photodiodes 124.

In order to serve miniaturization, pixel size is decreased and a multilevel interconnect structure is employed. For example, the substrate 101 is covered by a series of dielectric layers 130, such as an interlevel dielectric (ILD) layer and intermetal dielectric (IMD) layers. As pixel width is scaled down, however, the thickness of the dielectric layers, i.e. vertical dimension of the pixel, remains the same. As a result, incident light 160 and 160' strikes the surface of the topmost dielectric layer 130. This light is then transmitted through the underlying dielectric layers 130 to the underlying pixels. It is not uncommon for incident light 160 and 160' to strike the surface of the photodiode device at a variety of angles θ. For example, the light 160 can strike the surface at a near perpendicular angle, and light 160' at an oblique incident angle.

Light 160, striking the surface at a near perpendicular angle, is transmitted to a photodiode 120I (a pixel) underlying the contact location. This is optimal for image sensing performance. However, light 160' striking the surface at oblique angle θ may then be transmitted to a nearby photodiode 120II rather than to the pixel 120I directly underlying the contact surface. This is crosstalk. The crosstalk problem can cause degraded image resolution for black and white sensors or complicate color correction for color sensors.

FIG. 2 illustrates curves of crosstalk versus incident angle of conventional CMOS image sensors of different pixel widths. Crosstalk is critical at oblique angles of approximately ±15°. As pixel width is reduced, crosstalk of curves III and IV exceeds 50% at incident angle of ±15°.

It is beneficial to further reduce crosstalk when pixel width is scaled below 3 μm.

SUMMARY

Embodiments of the invention provide an image sensor device comprising an array of active photosensing pixels on a substrate. At least one side of each pixel has a width equal to or less than approximately 3 μm. At least one dielectric layer is disposed on the substrate covering the array. A color filter is disposed on the dielectric layer. An array of microlens is disposed on or under the color filter corresponding to the array, and the sum of the thickness of all dielectric layers and the color filter divided by the pixel width is equal to or less than about approximately 1.87.

Further scope of applicability of the invention will become apparent from the detailed description given hereinafter. However, it should be understood that the detailed description and specific examples, while indicating embodiments of the invention, are given by way of illustration only, since various changes and modifications within the spirit and scope of the invention will become apparent to those skilled in the art from this detailed description.

DESCRIPTION OF THE DRAWINGS

The invention can be more fully understood by reading the subsequent detailed description in conjunction with the examples and references made to the accompanying drawings, wherein.

DETAILED DESCRIPTION

Figure 1:
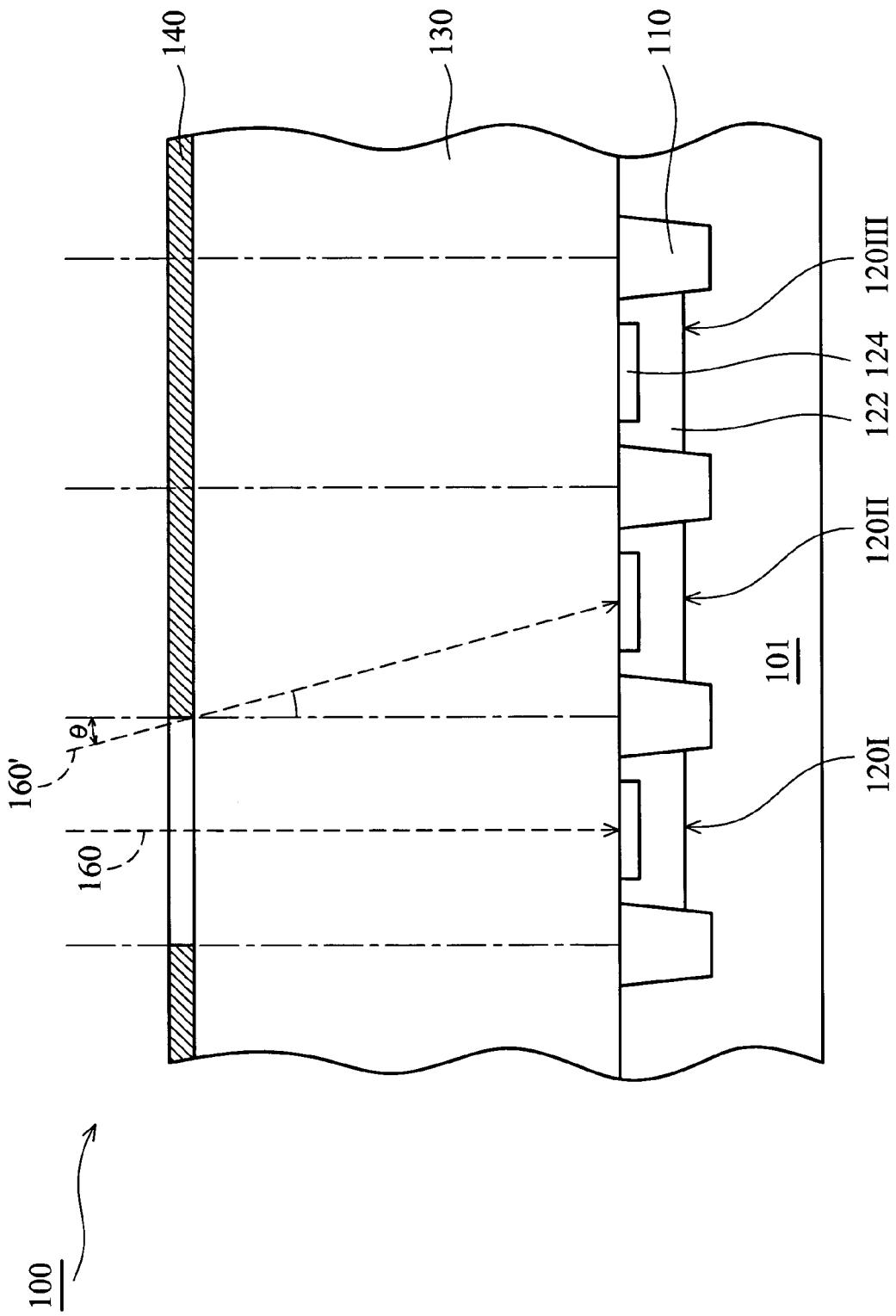
FIG. 1 is a cross section illustrating a typical image sensor device.
Figure 2:
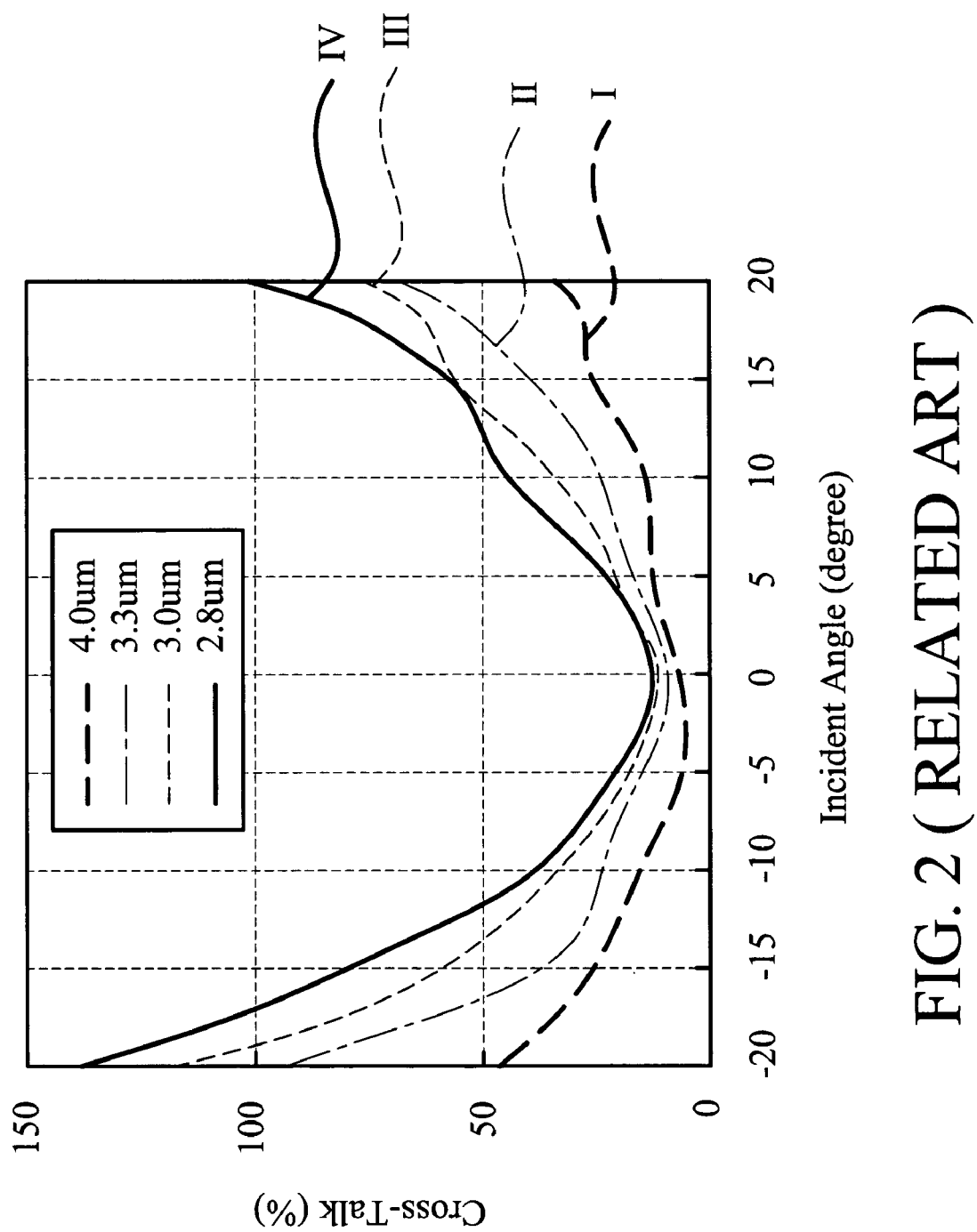
FIG. 2 shows a graph illustrating curves of cross-talk versus incident angle of related art CMOS image sensors with different pixel widths.
Figure 3:
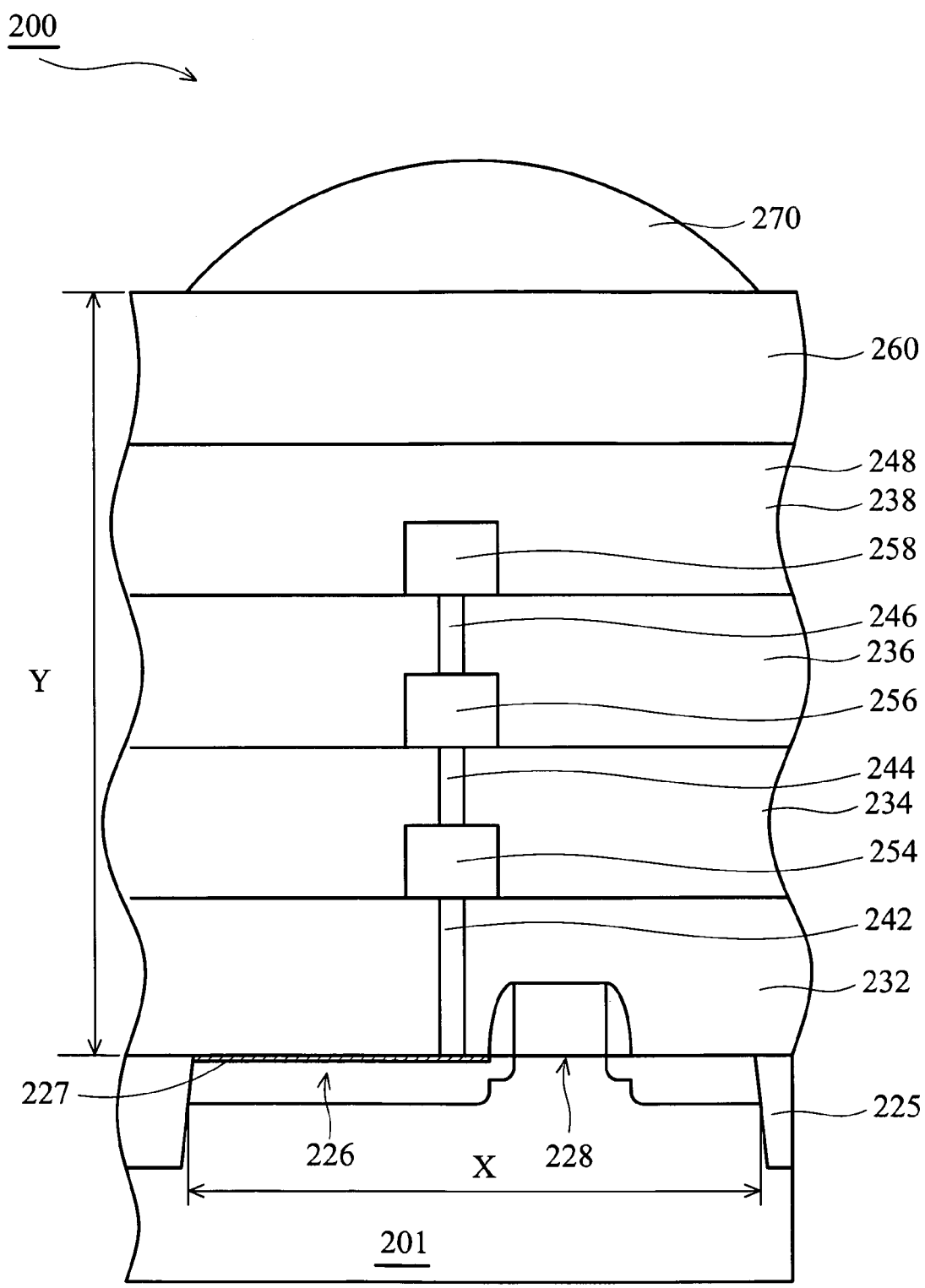
FIG. 3 is a cross section of an embodiment of a pixel of an image sensor device.

FIG. 3 is a cross section of a pixel of an embodiment of an image sensor device with 3-layer metals. In FIG. 3, an active photosensing pixel of an image sensor device 200 comprises a semiconductor substrate 201 comprising an array of photodiodes 226 and a CMOS logic circuit 228. The active photosensing pixel comprises a photodiode 226 with a pinned layer 227 thereon. Each photodiode 226 is separated from other photodiodes by an array of isolation structures 225, such as shallow trench isolation (STI) structures. At least one dielectric layer is disposed on the substrate covering the active photosensing pixel. A color filter 260 is disposed on the least one dielectric layer. A microlens 270 is disposed on the color filter 260 of the active photosensing pixel.

In order to achieve miniaturization, the pixel width is decreased and a multilevel interconnect structure is employed. The pixel width X is scaled down less than approximately 3 µm, preferably less than 2.5 µm, and more preferably less than 2 µm. The thickness Y of the multilevel interconnect structures is scaled down less than 5.72 µm, preferably less than 3 µm. The ratio of Y/X is preferably less than about 1.87. More specifically, the sum of the thickness of all dielectric layers and color filter divided by the pixel width is equal to or less than approximately 1.87.

The area of each pixel is equal to or less than approximately 10 µm², preferably less than 9 µm² and more preferably less than 6.25 µm².

The substrate 201, for example, is covered by a series of dielectric layers, such as an interlevel dielectric (ILD) layer 232, intermetal dielectric (IMD) layers 234 and 236, and a passivation layer 238. Dielectric layers 232, 234, 236, 238 comprise a silicon oxide layer, a silicon nitride layer, a silicon oxynitride layer, or spin-on materials. Each dielectric layer has a thickness in a range of approximately 0.1 to 1.5 µm. The thickness of the silicon oxide layer is preferably a less than approximately 4.5 µm. The thickness of the silicon nitride layer is preferably less than approximately 1.0 µm. Further, a 4-layer interconnect is disposed in the dielectric layer. A plug pattern of interconnects 242, 244, and 246 and metal lines 254, 256 and 258 are formed in the IMD layers 234, 236 and passivation layer 238.

A color filter 260 is disposed on the passivation layer 248. The color filter is a color transparent polymer. The thickness of the color filter 260 is in a range of approximately 0.5 to 6.0 µm, preferably less than 2.0 µm. A microlens 270 is formed over the color filter 260.

Crosstalk may be measured by providing a mask (not shown) over a photodetector device array that allows radiation (e.g., light) to enter the IC over only one underlying device. The nearby device response is then measured and the undesired signal divided by desired signal is calculated and defined as crosstalk. Informal industry requirements for high density image sensor provide crosstalk of less than 50% at an oblique incident angle of 15°.

Figure 4:
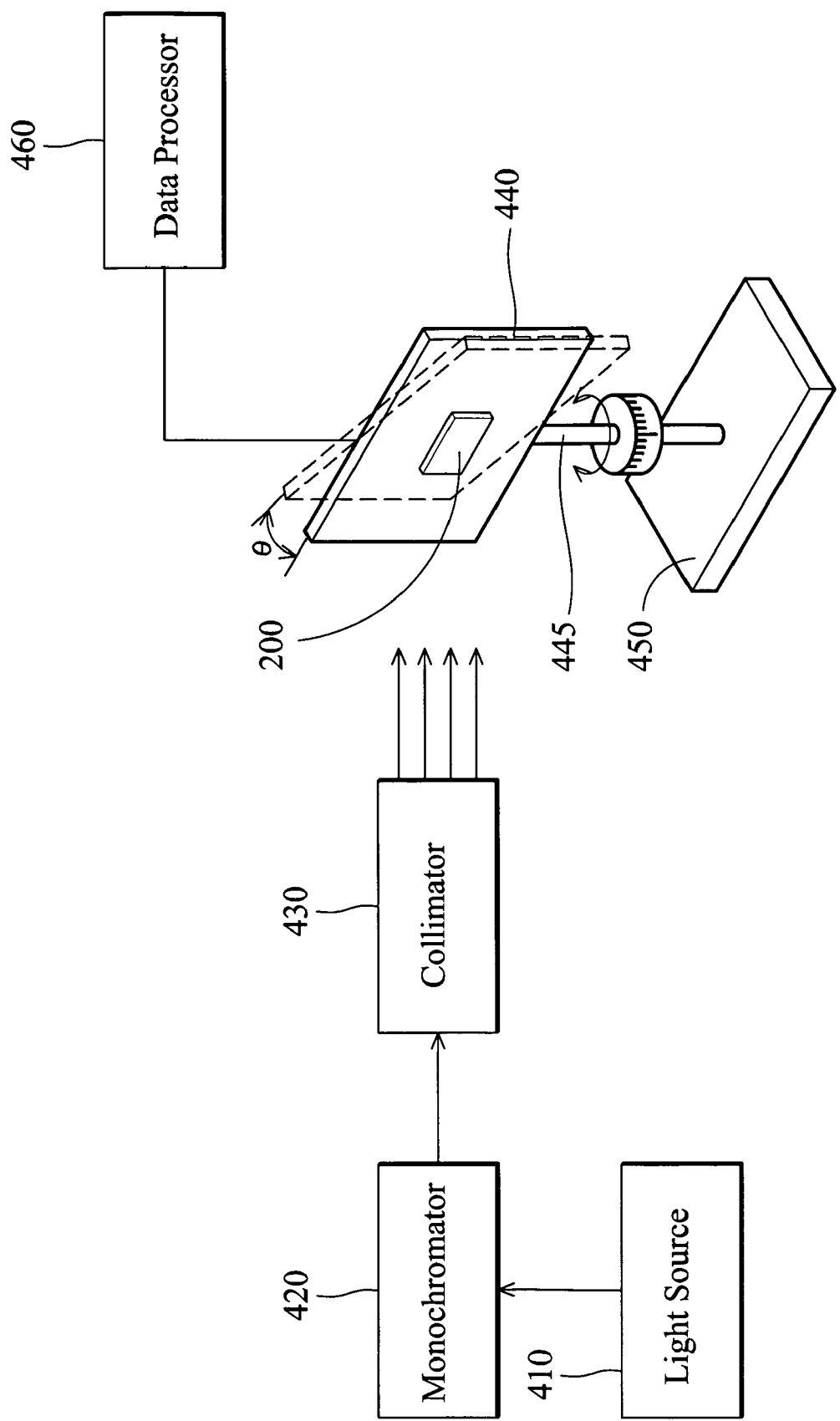
FIG. 4 shows a schematic diagram illustrating an embodiment of an apparatus for measuring crosstalk.

FIG. 4 shows a schematic diagram illustrating an embodiment of an apparatus for measuring crosstalk. A light emitted from a light source 410 passes through a monochromator 420 and collimator 430, thereby creating homogenous and parallel incident light. An image sensor device 200 is fixed on a board 440. The board is overlying a rotation axis 445 and supported by a rotable shaft on a table 450. An oblique incident light is thus created by controlling the rotated angle θ. An output signal is transmitted to a data processor, thereby measuring the relation of crosstalk versus oblique incident angle.

Figure 5:
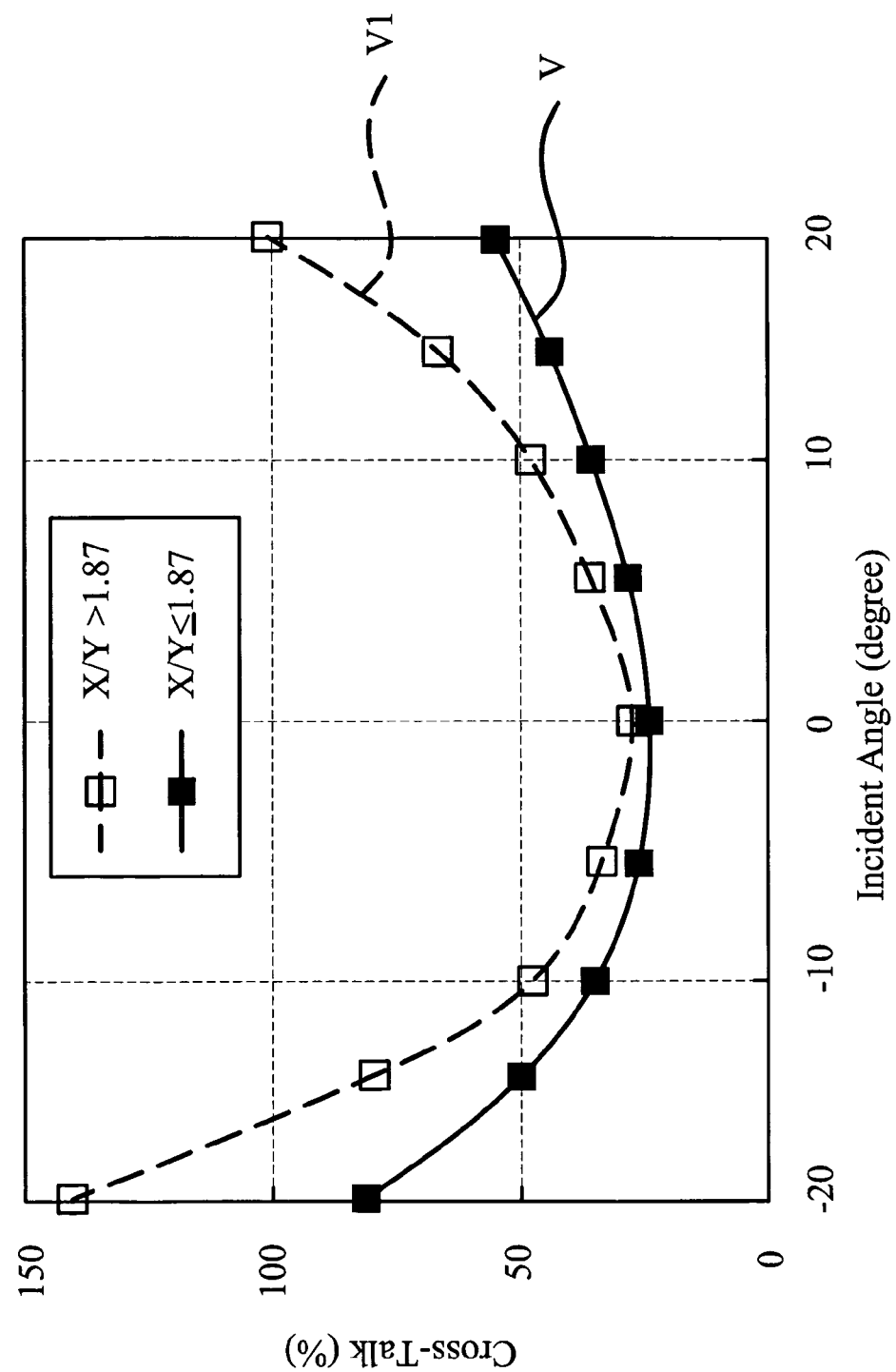
FIG. 5 shows a graph illustrating the relationship of cross-talk versus oblique incident angle as a pixel width less than 3.0 μm.

FIG. 5 is the relationship of crosstalk versus oblique incident angle of a pixel width less than 3.0 µm. Crosstalk of the pixel with Y/X≦1.87 is apparently less than 50% at an oblique incident angle of 15°. The pixel with higher dielectric layer thickness, i.e. Y/X>1.87, cannot meet the requirement of crosstalk less than 50% at 15°.

Figure 6:
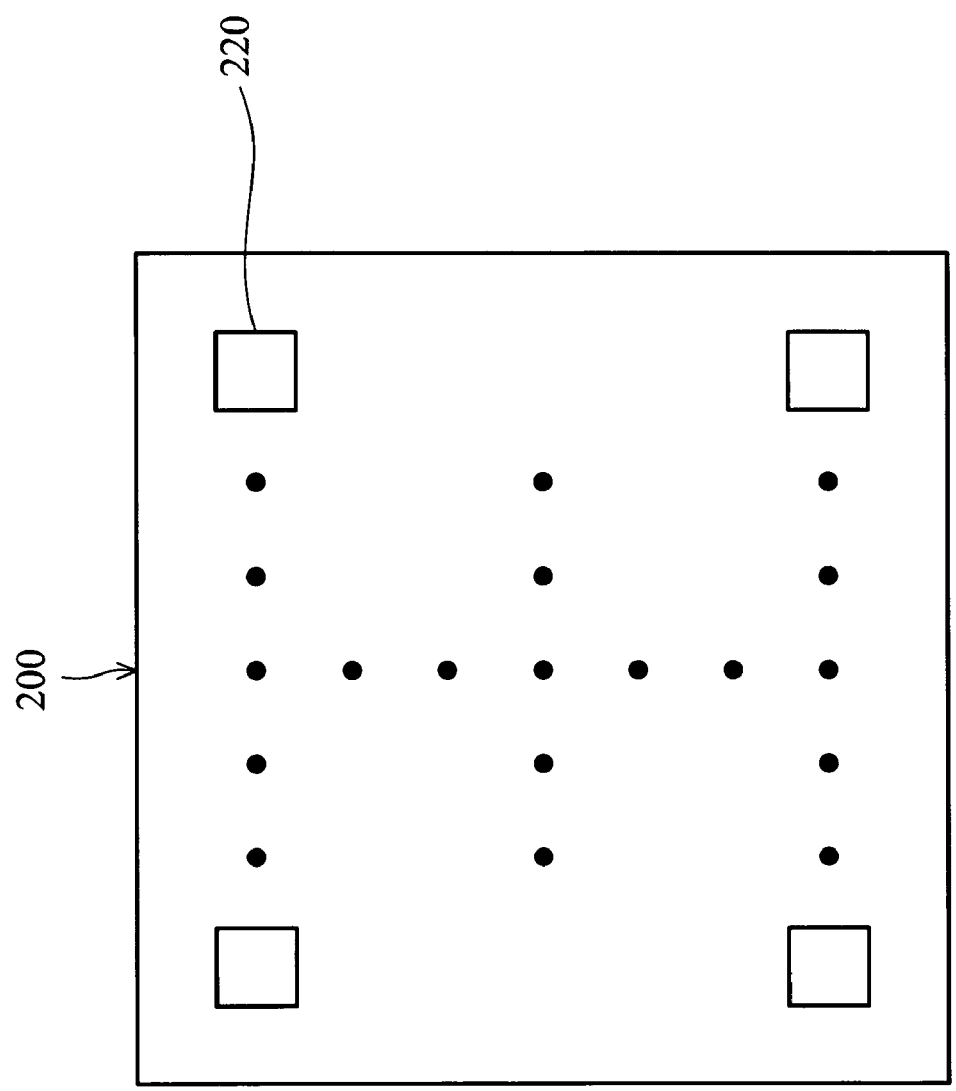
FIG. 6 is a schematic diagram illustrating embodiment of an image sensor array.
Figure 7:
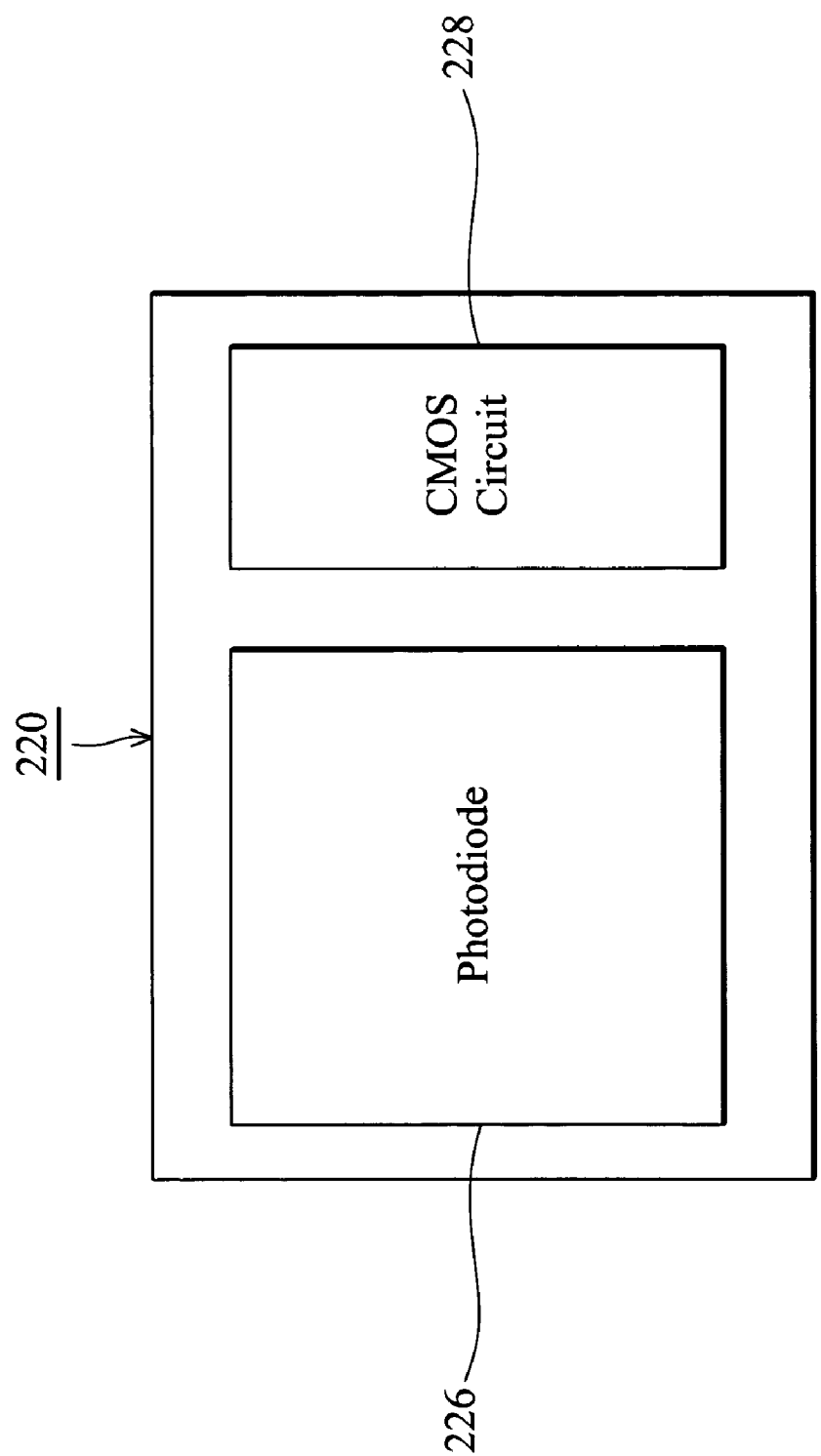
FIG. 7 is a schematic diagram illustrating a pixel of an embodiment of an image sensor device.

Some embodiments of CMOS image sensor are directed to an electronic device for digital still camera (DSC) applications. In FIG. 6, an image sensor device 200 comprises an array of pixels 220. Each pixel 220 comprises a photodiode 226 and a CMOS circuit 228, as shown in FIG. 7.

Figure 8:
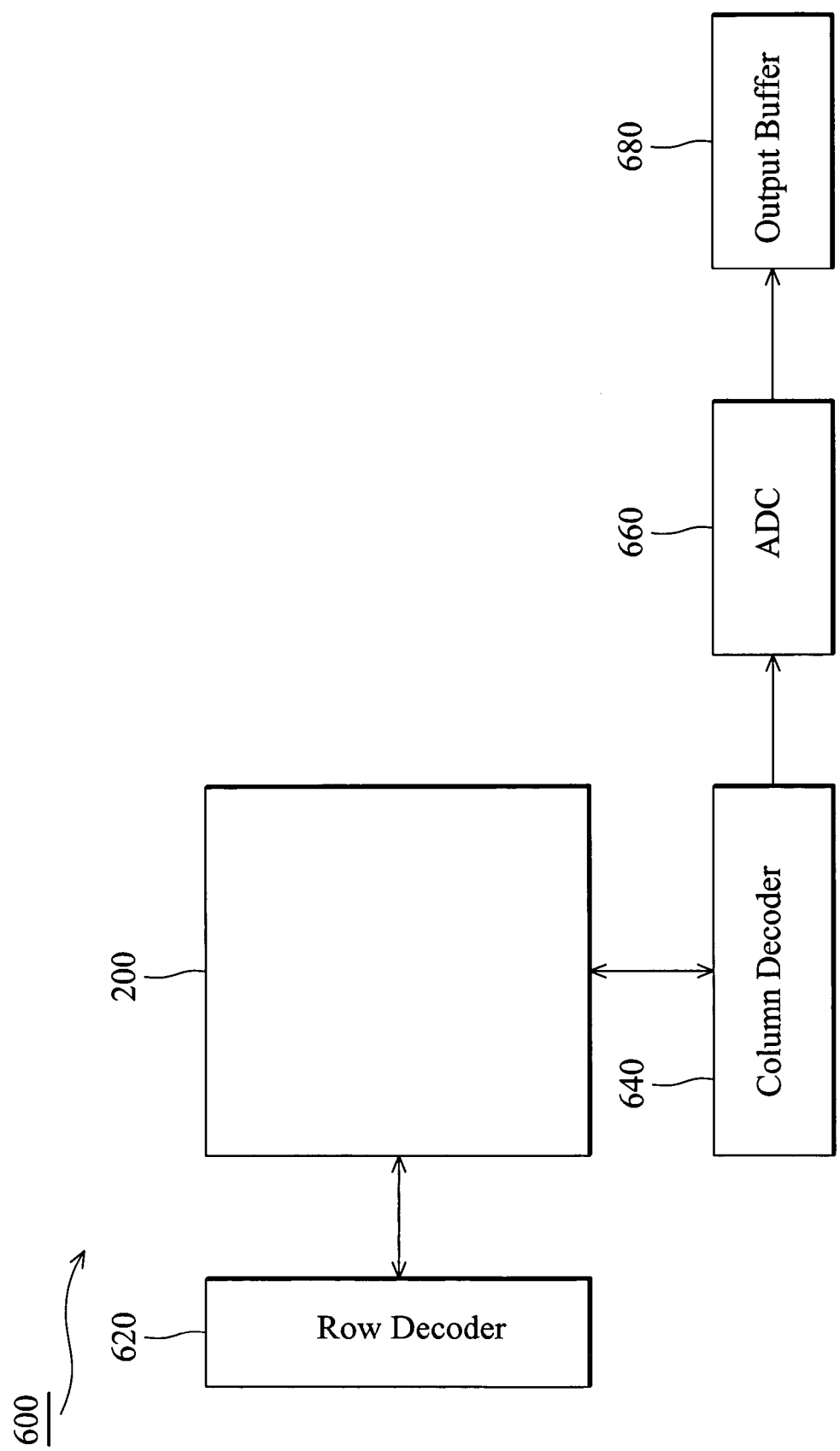
FIG. 8 shows a block diagram illustrating an embodiment of an electronic device.

Image sensor device 200 can easily be integrated with other control units, such as a row decoder and a column decoder, an analog to digital converter (ADC), and a digital signal processor to form a system on a silicon chip. FIG. 8 shows a block diagram illustrating an embodiment of an electronic device 600. The electronic device 600 comprises an image sensor device configured to receive an optical image and generate an electrical analog signal 112 representing the image. A row decoder 620 and a column decoder 640 are used to address any one or multiple pixels and retrieve data from selected pixels. An ADC 660 is coupled to column decoder 640 to receive the analog signal and convert the analog signal into a digital signal. An output buffer 680 is connected to ADC to store digital signal converted by the ADC.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor device comprising:
   an array of active photosensing pixels on a substrate, at least one side of each pixel having a pixel width equal to or less than 3 µm;
   at least one dielectric layer disposed on the substrate covering the array; and
   a color filter on the least one dielectric layer;
   wherein the sum of the thickness of all dielectric layers and the color filter divided by the pixel width is equal to or less than about 1.87 such that crosstalk of each pixel is approximately lass than 50% at an oblique incident angle of 15°.

2. The image sensor device according to claim 1, wherein each photosensing pixel comprises a photodiode and a CMOS circuit.

3. The image sensor device according to claim 1, further comprising an array of microlenses on the color filter corresponding to the array.

4. The image sensor device according to claim 1, wherein each photosensing pixel comprises a photodiode with a pinned layer thereon.

5. The image sensor device according to claim 1, wherein the at least one side of each pixel has a pixel width equal to or less than approximately 2.5 µm.

6. The image sensor device according to claim 1, wherein the at least one side of each pixel has a pixel width equal to or less than approximately 2 µm.

7. The image sensor device according to claim 1, further comprising a 4-layer interconnect disposed in the at least one dielectric layer.

8. The image sensor device according to claim 1, wherein the least one dielectric layer comprises a silicon oxide layer, a silicon nitride layer, a silicon oxynitride layer, or spin-on materials.

9. The image sensor device according to claim 1, wherein the least one dielectric layer comprises a silicon oxide layer with a thickness less than approximately 4.5 µm.

10. The image sensor device according to claim 1, wherein the least one dielectric layer comprises a silicon nitride layer with a thickness less than approximately 1.0 µm.

11. An electronic device comprising:
    an image sensor device as claimed in claim 1, responsive to an optical image, producing an analog electrical representation of the optical image;

a row decoder and a column decoder coupled to the image sensor device respectively to address one or multiple pixels and to retrieve data from selected pixels;

an analog-to-digital converter (ADO) coupled to the column decoder, operating to convert the analog electrical representation into a digital image; and an output buffer configured to store digital image data converted by the analog-to-digital converter.

12. An image sensor device comprising:

an array of active photosensing pixels on a substrate, each pixel having an area equal to or less than approximately 10 $\mu m^2$;

at least one dielectric layer disposed on the substrate covering the array; and a color filter on the least one dielectric layer;

wherein the sum of the thickness of all dielectric layers and the color filter divided by the pixel width is equal to or less than about 1.87 such that crosstalk of each pixel is approximately less than 50% at an oblique incident angle of 15°.

13. The image sensor device according to claim 12, wherein each photosensing pixel comprises a photodiode and a CMOS circuit.

14. The image sensor device according to claim 12, further comprising an array of microlenses on the color filter corresponding to the array.

15. The image sensor device according to claim 12, wherein each photosensing pixel comprises a photodiode with a pinned layer thereon.

16. The image sensor device according to claim 12, wherein each pixel comprises a pixel width in a first direction equal to or less than approximately 3 $\mu m$.

17. The image sensor device according to claim 12, wherein each pixel comprises a pixel width in a first direction equal to or less than approximately 2.5 $\mu m$.

18. The image sensor device according to claim 12, wherein each pixel comprises a pixel width in a second direction equal to or less than approximately 3 $\mu m$.

19. The image sensor device according to claim 12, wherein each pixel comprises a pixel width in a second direction equal to or less than approximately 2.5 $\mu m$.

20. The image sensor device according to claim 12, wherein the area of each pixel is equal to or less than approximately 6.25 $\mu m^2$.

21. The image sensor device according to claim 12, further comprising a 4-layer interconnect disposed in the at least one dielectric layer.

22. The image sensor device according to claim 12, wherein the least one dielectric layer comprises a silicon oxide layer, a silicon nitride layer, a silicon oxynitride layer, or spin-on materials.

23. The image sensor device according to claim 12, wherein the least one dielectric layer comprises a silicon oxide layer with a thickness less than approximately 4.5 $\mu m$.

24. The image sensor device according to claim 12, wherein the least one dielectric layer comprises a silicon nitride layer with a thickness less than approximately 1.0 $\mu m$.

* * * * *